United States Patent
Bonora et al.

(10) Patent No.: US 6,364,595 B1
(45) Date of Patent: Apr. 2, 2002

(54) RETICLE TRANSFER SYSTEM

(75) Inventors: Anthony C. Bonora, Menlo Park, CA (US); William J. Fosnight; Joshua W. Shenk, both of Austin, TX (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/247,695

(22) Filed: Feb. 10, 1999

(51) Int. Cl.[7] ............................................... B65B 69/00

(52) U.S. Cl. .................... 414/416.1; 294/106; 414/937; 414/941

(58) Field of Search ............................... 414/416, 937, 414/939, 940, 941; 294/81.51, 81.61, 106, 902

(56) References Cited

U.S. PATENT DOCUMENTS

| | | | |
|---|---|---|---|
| 4,532,970 A | | 8/1985 | Tullis et al. ................. 141/98 |
| 4,534,389 A | | 8/1985 | Tullis ........................ 141/98 |
| 4,963,069 A | * | 10/1990 | Wurst et al. ................. 414/416 |
| 5,752,796 A | * | 5/1998 | Muka ..................... 414/416 X |
| 5,788,458 A | * | 8/1998 | Boonora et al. ........ 414/416 X |
| 5,984,610 A | * | 11/1999 | Rush et al. .................. 414/416 |

OTHER PUBLICATIONS

Parikh, et al., "SMIF: A Technology for Wafer Cassette Transfer in VLSI Manufacturing," *Solid State Technology*, Jul. 1984, pp. 111–115.

* cited by examiner

Primary Examiner—Donald W. Underwood
(74) Attorney, Agent, or Firm—Fliesler Dubb Meyer & Lovejoy LLP

(57) ABSTRACT

A reticle transfer system is disclosed for transferring reticles between a reticle-carrying SMIF container and a process tool. The reticle transfer system according to the present invention includes an arm assembly having a transfer arm and a gripping mechanism affixed to the end of the transfer arm. Once the container carrying the reticle has been opened, the gripping mechanism is rotated and translated to a position adjacent the reticle so that it may access the reticle and transfer it into the minienvironment through an access port in the minienvironment. In order to precisely, easily and repeatedly position the gripping mechanism in the desired location to grip and transfer the reticle, the gripping mechanism includes four downwardly extending posts spaced apart from each other so as to contact an outer rim of the container door as the gripping mechanism is lowered into position to grip and transfer the reticle. Once the four posts are seated in contact with the outer rim of the container door, the gripping mechanism is fixed in the proper position so that a pair of grippers within the gripping mechanism may rotate inward and grip the reticle. The posts also allow proper positioning of the gripping mechanism with respect to the container door and support platform within the minienvironment when returning the reticle to the container door or depositing the reticle on the minienvironment support platform.

17 Claims, 15 Drawing Sheets

RETICLE TRANSFER SYSTEM

CROSS REFERENCE TO RELATED APPLICATION

This application is related to U.S. Pat. No. 5,788,458, entitled, "METHOD AND APPARATUS FOR VERTICAL TRANSFER OF A SEMICONDUCTOR WAFER CASSETTE", to Bonora et al., which patent is incorporated by reference herein and which patent is assigned to the owner of the present application.

BACKGROUND OF THE INVENTION

1. Field of the Invention

The present invention relates to a transfer device for use with standardized mechanical interface (SMIF) systems for facilitating semiconductor wafer fabrication, and in particular to a transfer mechanism for gripping and transporting a reticle between a storage and transport container and a process tool.

2. Description of the Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 $\mu$m to above 200 $\mu$m. Particles with these sizes can be very damaging in semiconductor processing because of the small geometries employed in fabricating semiconductor devices. Typical advanced semiconductor processes today employ geometries which are one-half micron ($\mu$m) and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.2 $\mu$m and below. In the future, geometries will become smaller and smaller and hence smaller and smaller contamination particles become of interest.

A SMIF system has three main components: (1) sealed pods, having a minimal volume, used for storing and transporting workpieces and/or cassettes which hold the workpieces; (2) enclosures placed over access ports and workpiece processing areas of processing equipment so that the environments inside the pods and enclosures (after having clean air sources) become miniature clean spaces; and (3) a transfer mechanism to load/unload workpieces and/or workpiece cassettes from a sealed pod without contamination of the workpieces from external environments.

Workpieces such as reticles are transferred around within a reticle or semiconductor wafer fab within SMIF pods which are in general comprised of a pod door which mates with a pod shell to provide a sealed environment in which the reticles may be stored and transferred. In order to transfer reticles between a SMIF pod and a process tool within a fab, a pod is typically loaded either manually or automatedly on a load port on a front of the process tool. Once the pod is positioned on the load port, mechanisms within the port door unlatch the pod door from the pod shell so that the reticle may be transferred from within the pod into the process tool.

When transferring a reticle either automatedly or manually between a pod and the process tool, it is desirable to minimize contact with the upper and lower surfaces of the reticle. Any such contact may generate particles and/or affect the pattern etched in the reticle. In view of this minimal contact, the engagement between the reticle and gripping mechanism must be minimal and precisely controlled. It is therefore necessary to precisely position a gripping mechanism in the desired orientation to the reticle when gripping and transferring the reticle.

In order to transfer reticles in conventional systems, an input/output device is provided for receiving the reticle and separating the reticle pod. Thereafter, a three degrees of freedom (r, theta and z) workpiece handling robot is used to transfer the reticle from the door of the reticle pod onto the support plate within the minienvironment. Thereafter, a second workpiece transfer robot is used to transfer the reticle within the process tool. This arrangement takes up a significant amount of space in front of the process tool.

SUMMARY OF THE INVENTION

It is therefore an advantage of the present invention to provide a reticle transfer system for transferring reticles between a storage and transfer container and a process tool without exposure to contaminants and/or particulates surrounding the container and process tool.

It is another advantage of the present invention to provide a reticle transfer system which may be precisely and easily positioned to grip a reticle to be transferred.

It is a further advantage of the present invention to provide a reticle transfer system having a small footprint.

It is a still further advantage of the present invention that there is no contact with the container door inside of the seal zone (i.e., where the shell meets the door) to prevent particulate generation in that area.

These and other advantages are provided by the present invention which in preferred embodiments relates to a reticle transfer system. The transfer system includes a load port comprising a port door and a port plate circumjacent about the port door. Once a reticle-carrying container is loaded onto the load port, mechanisms within the port door decouple the container shell from the container door. Thereafter, the port plate with the container shell supported thereon is raised upward while the port door and container door remain stationary to separate the shell from the door so that the reticle within the container may be accessed.

The reticle transfer system according to the present invention further includes an arm assembly having a transfer arm capable of rotation and translation, and a gripping mechanism affixed to the end of the transfer arm. Once the shell has been separated from the door, the gripping mechanism is rotated and translated to a position adjacent the reticle so that it may access the reticle and transfer it from the container door and into the minienvironment through an access port in the minienvironment. From the minienvironment, the reticle may be transferred within the process tool by a workpiece handling robot. Once processing of the reticle is completed, the gripping mechanism may then transfer the reticle from within the minienvironment back to the container door.

In order to precisely, easily and repeatedly position the gripping mechanism in the desired location to grip and transfer the reticle, the gripping mechanism includes four downwardly extending posts spaced apart from each other so as to contact an outer rim of the container door as the gripping mechanism is lowered into position to grip and transfer the reticle. Once the four posts are seated in contact with the outer rim of the container door, the gripping mechanism is fixed in the proper position so that a pair of grippers within the gripping mechanism may rotate inward and grip the reticle. The posts also allow proper positioning of the gripping mechanism with respect to the container door and support platform within the minienvironment when returning the reticle to the container door or depositing the reticle on the minienvironment support platform.

The grippers of the gripping mechanism include a vertical surface for engaging the edges of the reticle. An elastomer such as an O-ring may be provided on the vertical surface to prevent slipping of the reticle upon engagement between the vertical surface and the reticle. Each of the grippers further includes an angled chamfer to engage a similarly angled section along the bottom edge of the reticle. The vertical surface, O-ring and chamfer of the gripper all allow the gripper to grip and transport a reticle without contacting the upper or lower surfaces of the reticle. The gripping mechanism further includes safety catches positioned under the reticle during transport. The safety catches do not contact the reticle during normal transport of the reticle, but are provided to prevent the reticle from separating from the gripping mechanism in the event the reticle gets dislodged from the chamfer on each of the grippers.

BRIEF DESCRIPTION OF THE DRAWINGS

The present invention will now be described with reference to the drawings in which.

DESCRIPTION OF PREFERRED EMBODIMENTS

The present invention will now be described with reference to FIGS. 1 through 20 which in general relate to a reticle transfer system for transferring reticles between a storage and transfer container and a process tool. While the present invention is described with respect to a SMIF system, it is understood that the present invention may be used with any of various containers for storing and transferring reticles or similar workpieces. Moreover, as explained below, it is additionally contemplated that the present invention operate to transfer bare reticles which have been loaded without a container directly onto a support plate of a reticle transfer system. The present invention complies with and allows compliance with all applicable SEMI standards.

Figure 1:
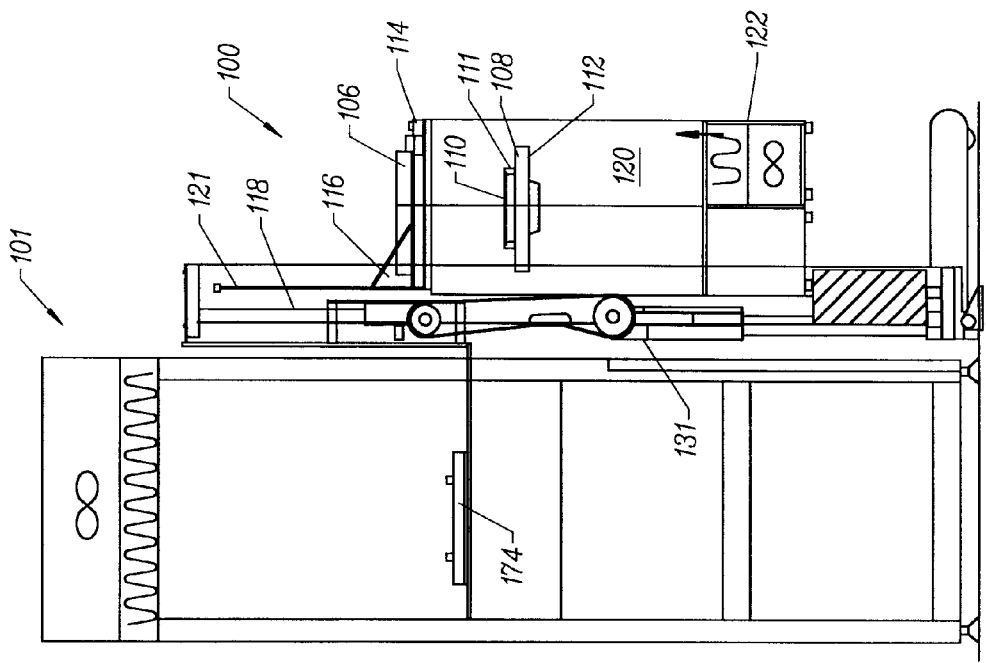
FIG. 1 is a side view of a reticle transfer system according to the present invention affixed to a minienvironment.

Referring now to FIG. 1, there is shown a reticle transfer system 100 according to the present invention mounted on the front end of a minienvironment 101, which minienvironment is in turn mounted to the front end of a process tool (not shown) for processing reticles. It is understood that the minienvironment may be integrated into the process tool in alternative embodiments. The reticle transfer system 100 includes a horizontally oriented load port 102 on which the reticle container 104 may be manually or automatedly loaded. As shown for example in FIGS. 1–5, container 104 includes a shell 106 and a door 108. The door 108 mates with the shell 106 to define a sealed environment in which a reticle 110 may be stored and transported.

Load port 102 includes a port door 112, and a port plate 114 surrounding the port door 112. When properly located on top of the load port 102, the door 108 lies in contact with the port door 112 and the outer rim of the shell 106 lies in contact with the port plate 114. Once the container 104 is properly positioned on the load port, latches (not shown) on the port plate rotate into engagement with the shell 106 to secure the shell to the port plate. The movement of the latches into and out of engagement with the shell 106 may be accomplished by a conventional solenoid or motor, the operation of which is controlled by a central processing unit ("CPU") for the system.

Figure 2:
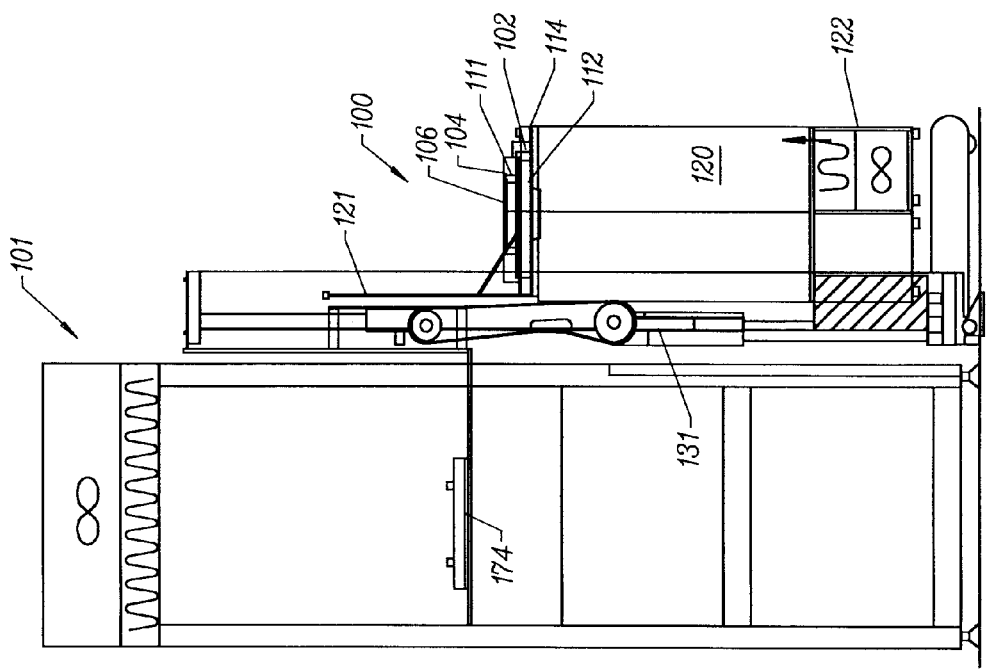
FIG. 2 is a side view of a reticle transfer system according to the present invention affixed to a minienvironment with the port plate of the reticle transfer system raised upward with respect to the port door.

Once the shell 106 is secured to the port plate 114, the shell 106 may be decoupled from the door 108 by a conventional decoupling mechanism provided within the port door 112. Details relating to such a decoupling mechanism are shown for example in U.S. Pat. No. 4,995,430, entitled "Sealable Transportable Container Having Improved Latch Mechanism", to Bonora et al., which patent is assigned to the owner of the present application and which patent is incorporated by reference in its entirety herein. Referring to FIG. 2 of the present invention, port plate 114 and minienvironment 120 (explained hereinafter) are affixed to a chassis 116. A drive nut (not shown) is rotationally mounted within the chassis 116 by, for example, tapered or roller bearings in a known manner, which drive nut is in turn threaded around a stationarily mounted lead screw 118. A conventional drive motor, such as a stepper or brushless motor (not shown) is further mounted on the chassis 116, which motor rotates the drive nut in response to control signals from the CPU. Rotation of the drive nut in one direction will raise the port plate 114, and rotation of the drive nut in the opposite direction will lower the port plate. The shell 106, supported on the port plate 114, moves upward and downward with the port plate. The door 108 and reticle 110 seated thereon, remain seated on the stationarily mounted port door 112. As would be appreciated by those of skill in the art, structures other than that disclosed above may be used to raise and lower the port plate 114 in alternative embodiments.

The reticle transfer system 100 further includes a minienvironment 120, a top portion of which is affixed to the port plate 114 so as to move upward and downward with the plate 114. The minienvironment 120 isolates the reticle 110 from the environment surrounding the reticle transfer system 100. A fan and filter unit 122 may be provided in the base of the minienvironment 120 for preventing particulates and/or contaminants from the environment surrounding the reticle transfer system 100 from entering into the minienvironment 120.

A shield 121 is fixedly attached to and extending up from the port plate 114. When the port plate 114 and minienvironment 120 are in their lowermost positions, the shield 121 covers an access port formed in the minienvironment. As the port plate and minienvironment move upward, the shield 121 is also moved upward to allow transfer of the reticle 110 through the minienvironment access port as explained hereinafter.

Figure 3:
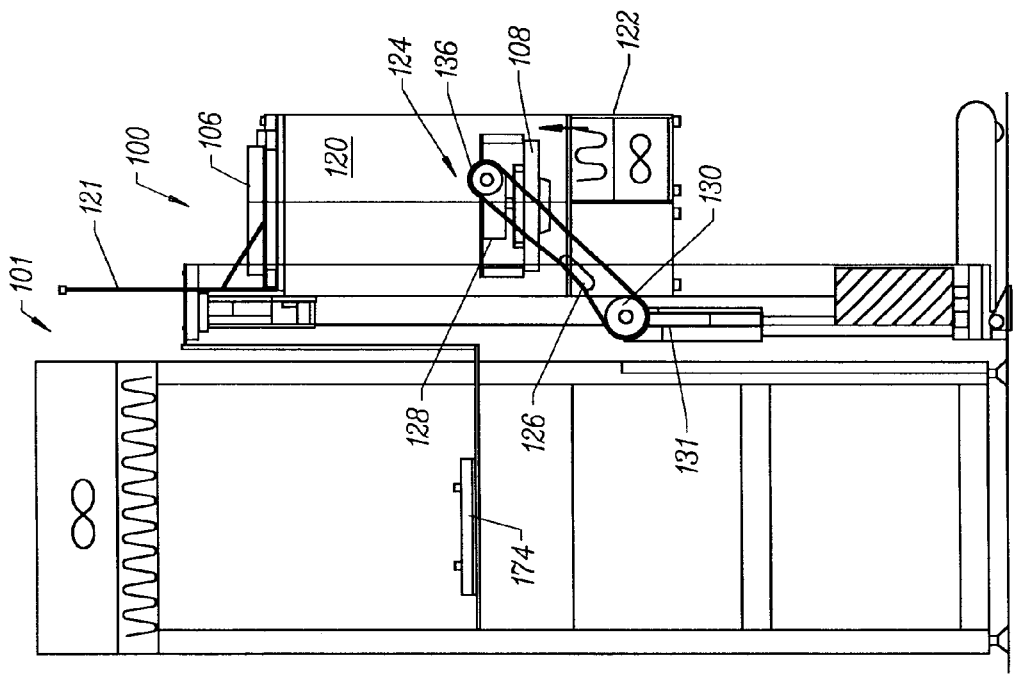
FIG. 3 is a side view of a reticle transfer system affixed to a minienvironment with the port plate raised to its uppermost position.
Figure 4:
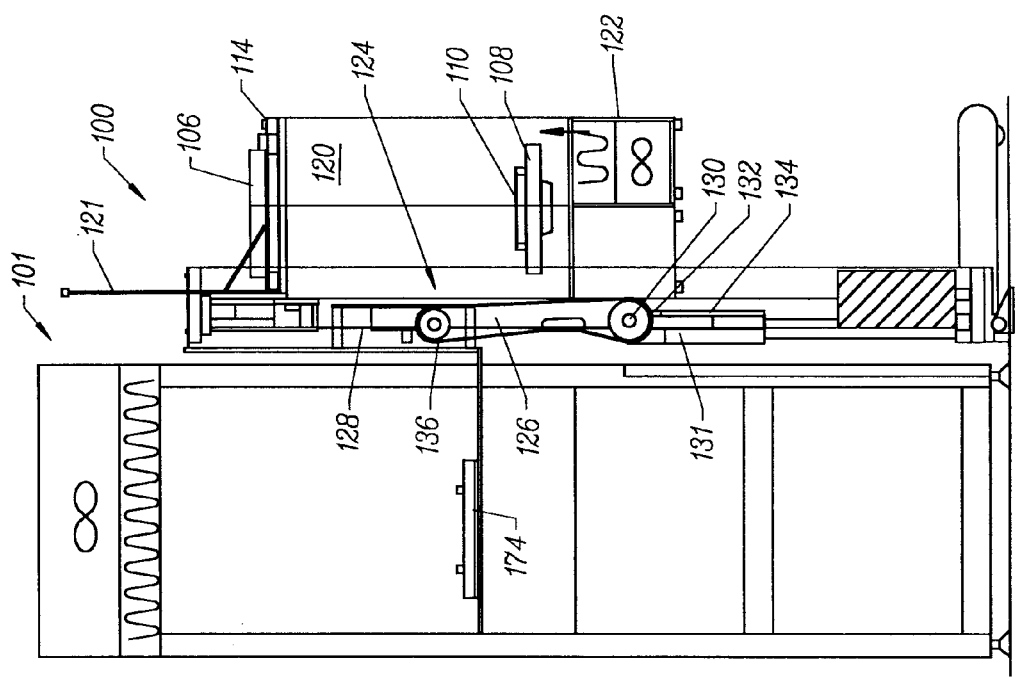
FIG. 4 is a side view of a reticle transfer system affixed to a minienvironment with the arm assembly engaging the reticle for transfer.

Once port plate 114 and minienvironment 120 have been raised to their uppermost position as shown in FIG. 3, an arm assembly 124 rotates from its home position shown in FIG. 3 to its reticle gripping position shown in FIG. 4. Arm assembly 124 includes a transfer arm 126 and a gripper mechanism 128 (described in greater detail with respect to FIGS. 5–13). In its home position, the arm 126 and gripping mechanism 128 are preferably vertically oriented so as to take up a minimal horizontal footprint and so as not to protrude into the minienvironment and/or process tool. The arm 126 is rotatably mounted to a chassis 131 by a shaft 130. A drive nut (not shown) is rotationally mounted within the chassis 131 by, for example, tapered or roller bearings in a known manner, which drive nut is in turn threaded around the lead screw 118. Thus, both the port plate 114 and arm assembly 124 translate along lead screw 118. A conventional drive motor, such as a stepper or brushless motor (not shown) is further mounted on the chassis 131, which motor rotates the drive nut in response to control signals from the CPU. Separate and independent from the rotational mounting of the arm 126 to the shaft 130, as explained in more detail hereinafter, the gripping mechanism 128 is rotationally mounted to a distal end 136 of arm 126 so that the arm 126 and gripping mechanism 128 may rotate separately and simultaneously. The CPU controls the rotation and/or translation of the arm 126 and gripping mechanism 128 so that the gripping mechanism 128 is properly positioned to grip and transfer the reticle.

Figure 5:
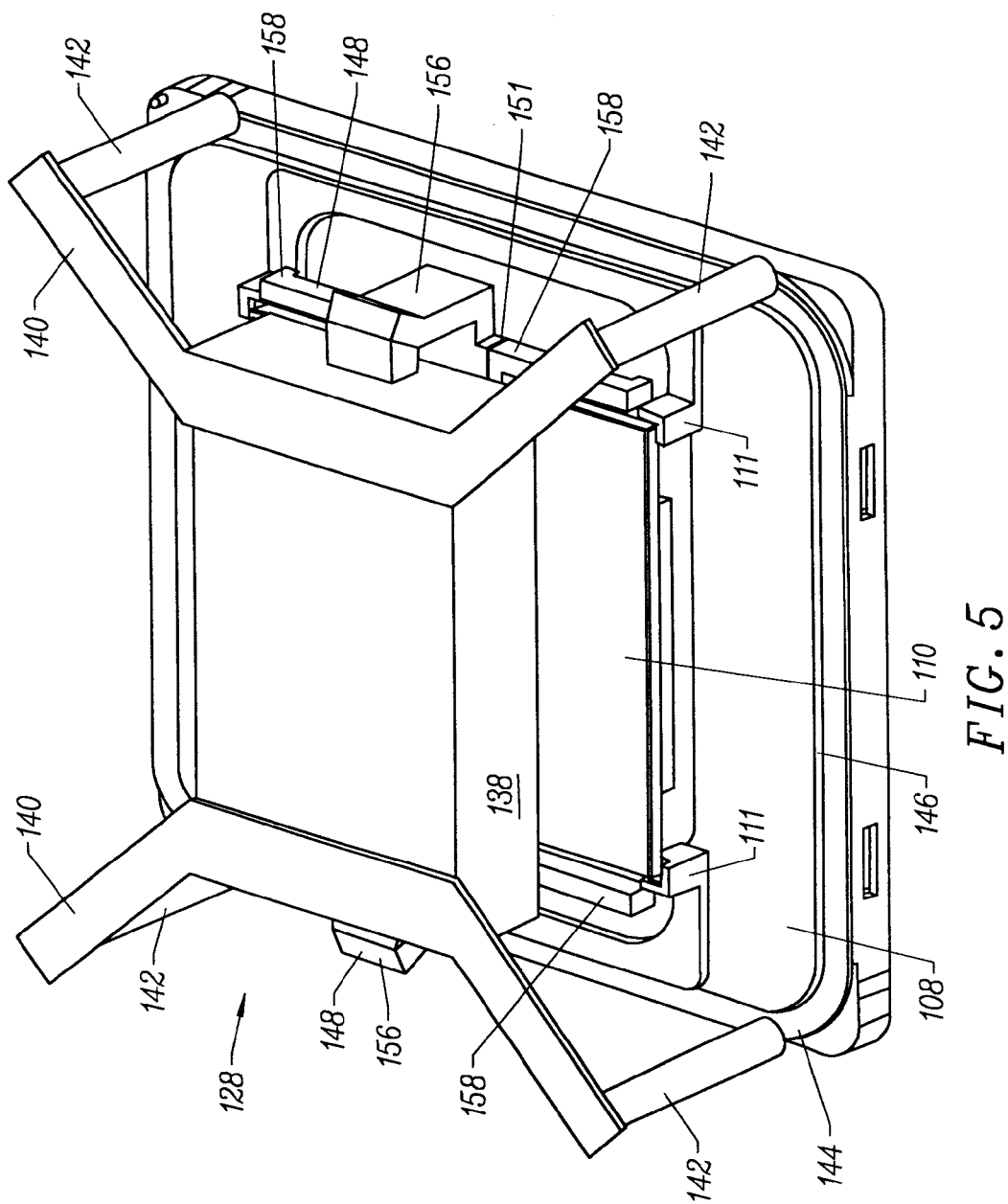
FIG. 5 is a perspective view of the gripper mechanism of the arm assembly for gripping and transporting the reticle.

Referring now to FIG. 5, gripper mechanism 128 includes an arm mounting block 138 which is rotatably mounted to the arm 126 (not shown in FIG. 5) as explained hereinafter. A pair of brackets 140 are fixedly mounted to the arm mounting block 138, with each bracket including a pair of posts 142 extending downward from its ends. The posts 142 are positioned so that as the arm assembly 124 moves the gripper mechanism 128 into engagement with the reticle 110, the posts 142 will contact and rest on an outer rim 144 of door 108. As shown in FIG. 5, the outer rim 144 is located radially outward from an elastomeric seal 146 that is contacted by shell 106 to form the isolated environment within the container 104. The posts 142 are provided to create a fixed, precise, repeatable and easily achieved position of the gripping mechanism 128 with respect to the door 108 and reticle 110 seated thereon.

Figure 6:
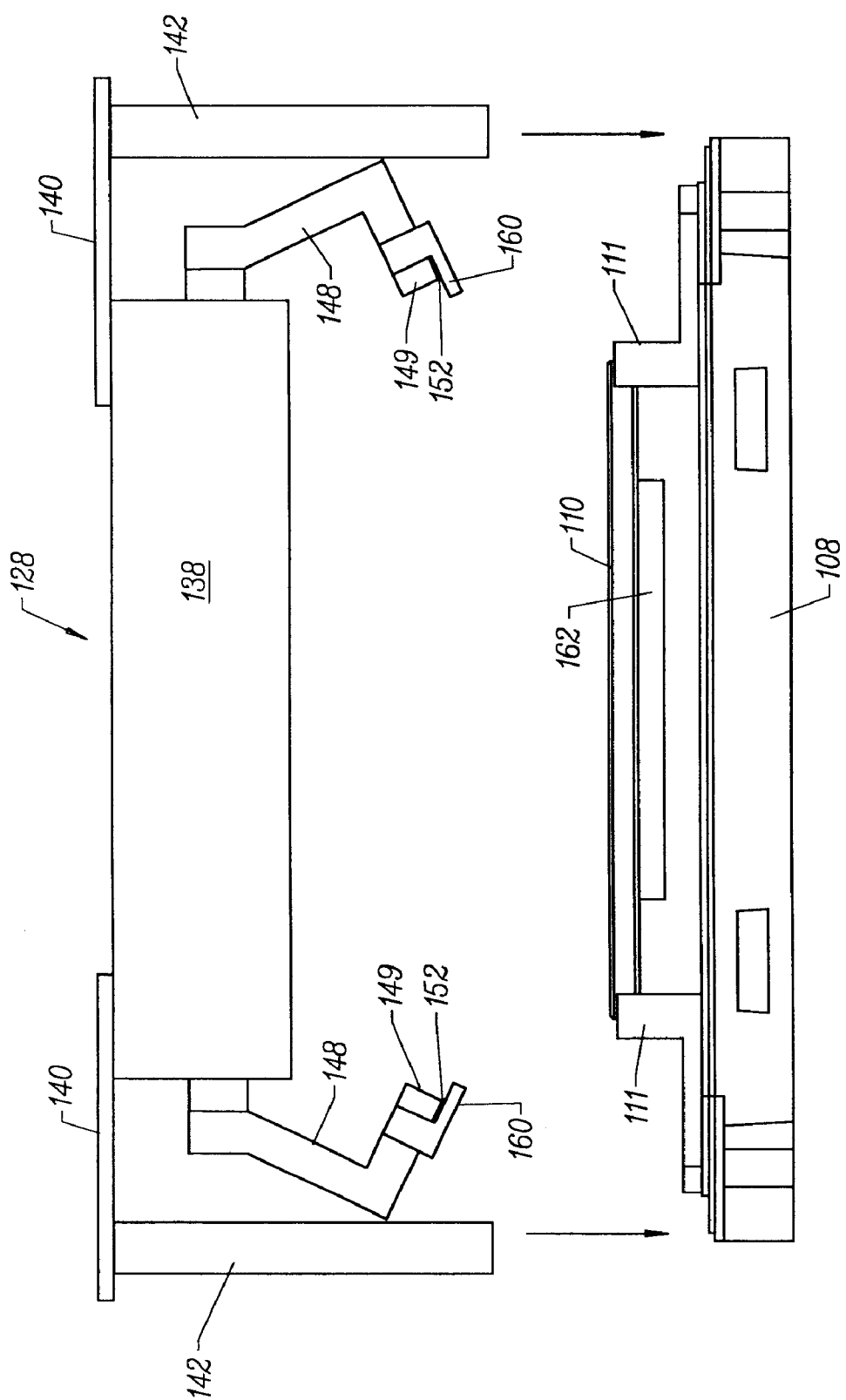
FIG. 6 is a side view of the gripper mechanism of the arm assembly prior to engagement with the port door and reticle.
Figure 7:
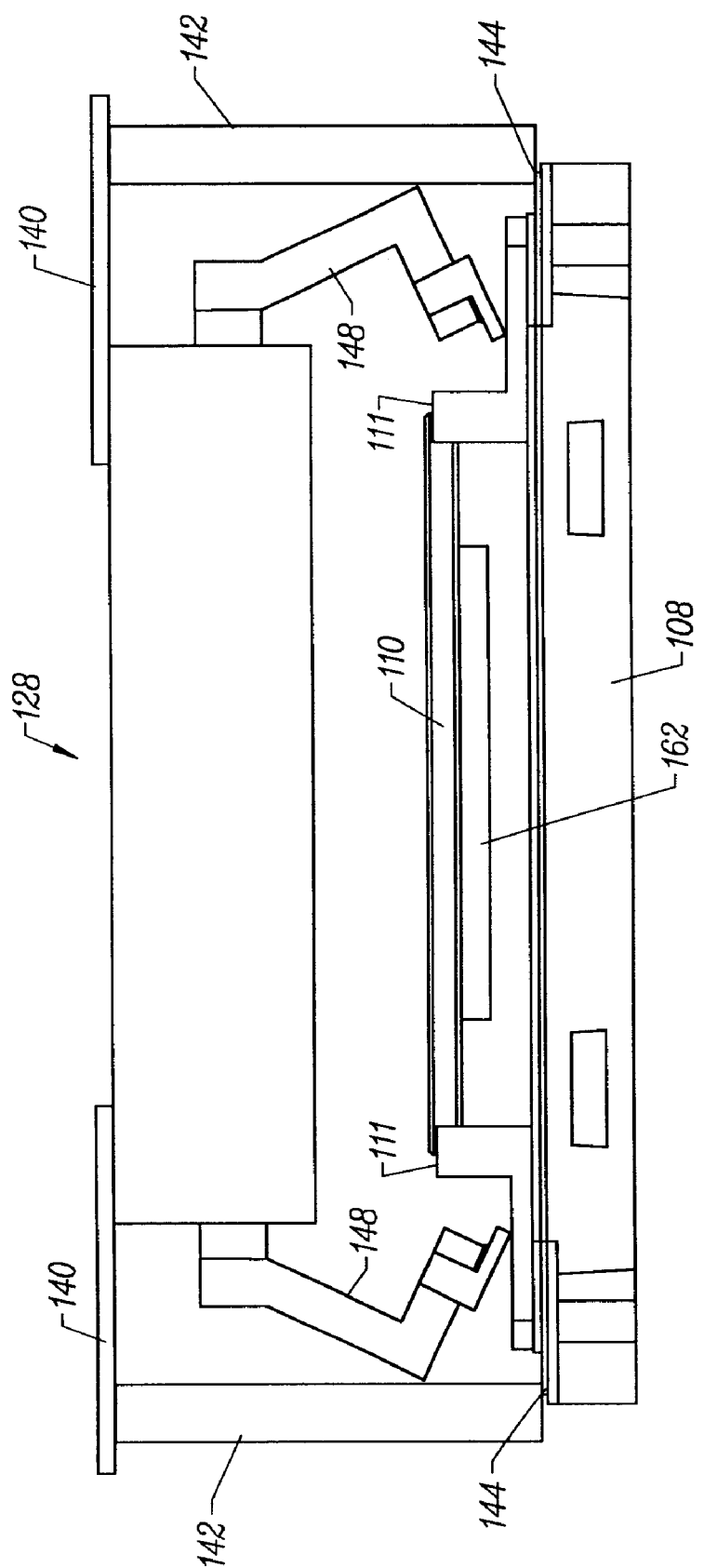
FIG. 7 is a side view of the gripper mechanism of the arm assembly engaged with the port door and prior to the grippers engaging the reticle.
Figure 8:
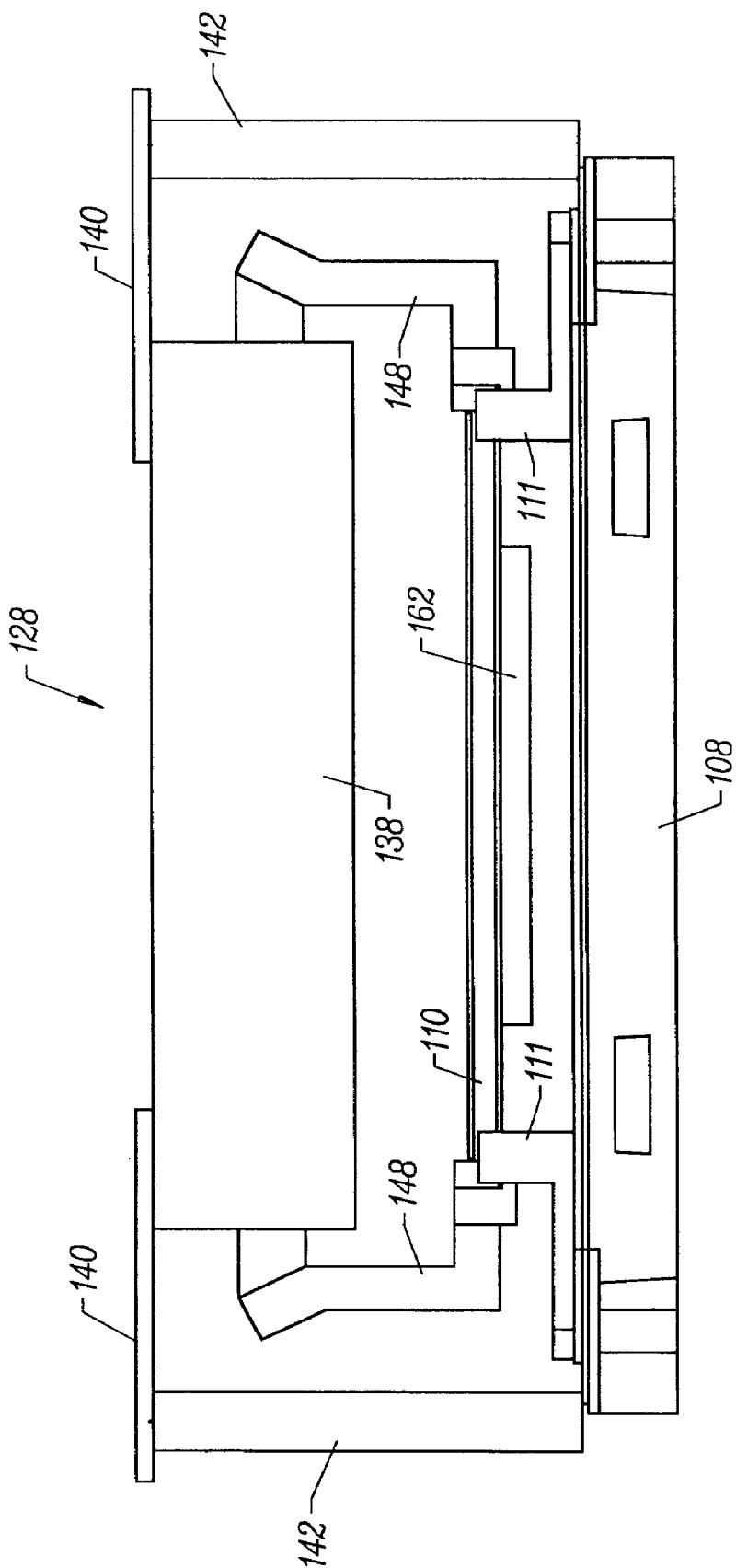
FIG. 8 is a side view of a gripper mechanism engaged with the port door and showing the grippers engaged with the reticle.

Referring now to FIGS. 6–8, gripping mechanism 128 further includes a pair of grippers 148 pivotally mounted to arm mounting block 138. As the gripping mechanism 128 is lowered into engagement with the door 108, posts 142 will engage and rest on the outer rim 144 to fix the position of the gripping mechanism 128 with respect to the door 108 as shown in FIG. 7. Thereafter, grippers 148 pivot inward toward the reticle 110 until the grippers 148 engage the reticle 110 as shown in FIG. 8. The reticle is seated on standoffs 111 mounted to the door 108 at the corners of the reticle. The pivoting of the grippers is controlled by the CPU, and is activated by sensors (not shown) within the arm mounting block 138 which detect the engagement of the posts 142 with the outer rim 144.

Figure 9:
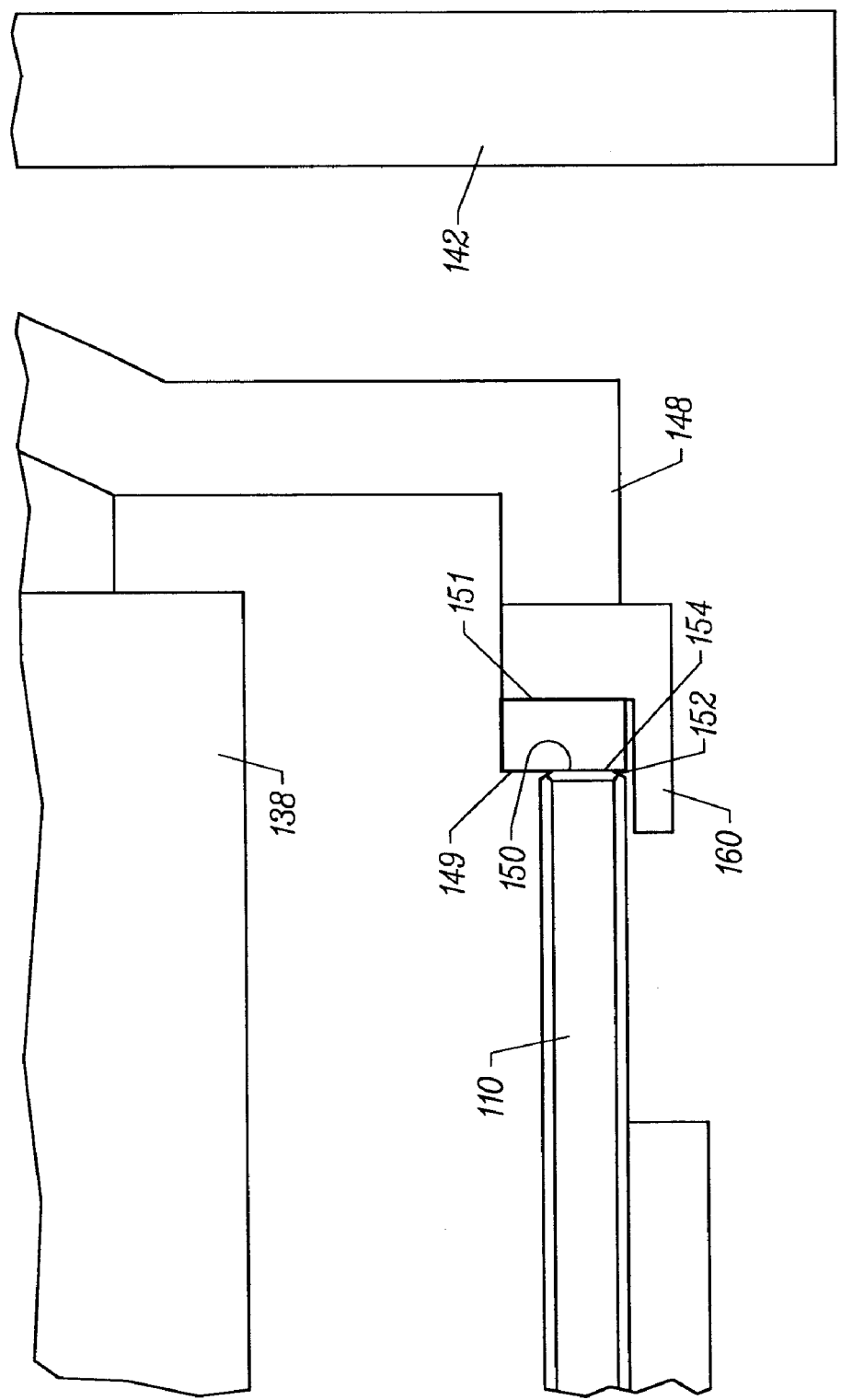
FIG. 9 is an enlarged side view showing the details of the engagement of one of the grippers with the reticle.
Figure 10:
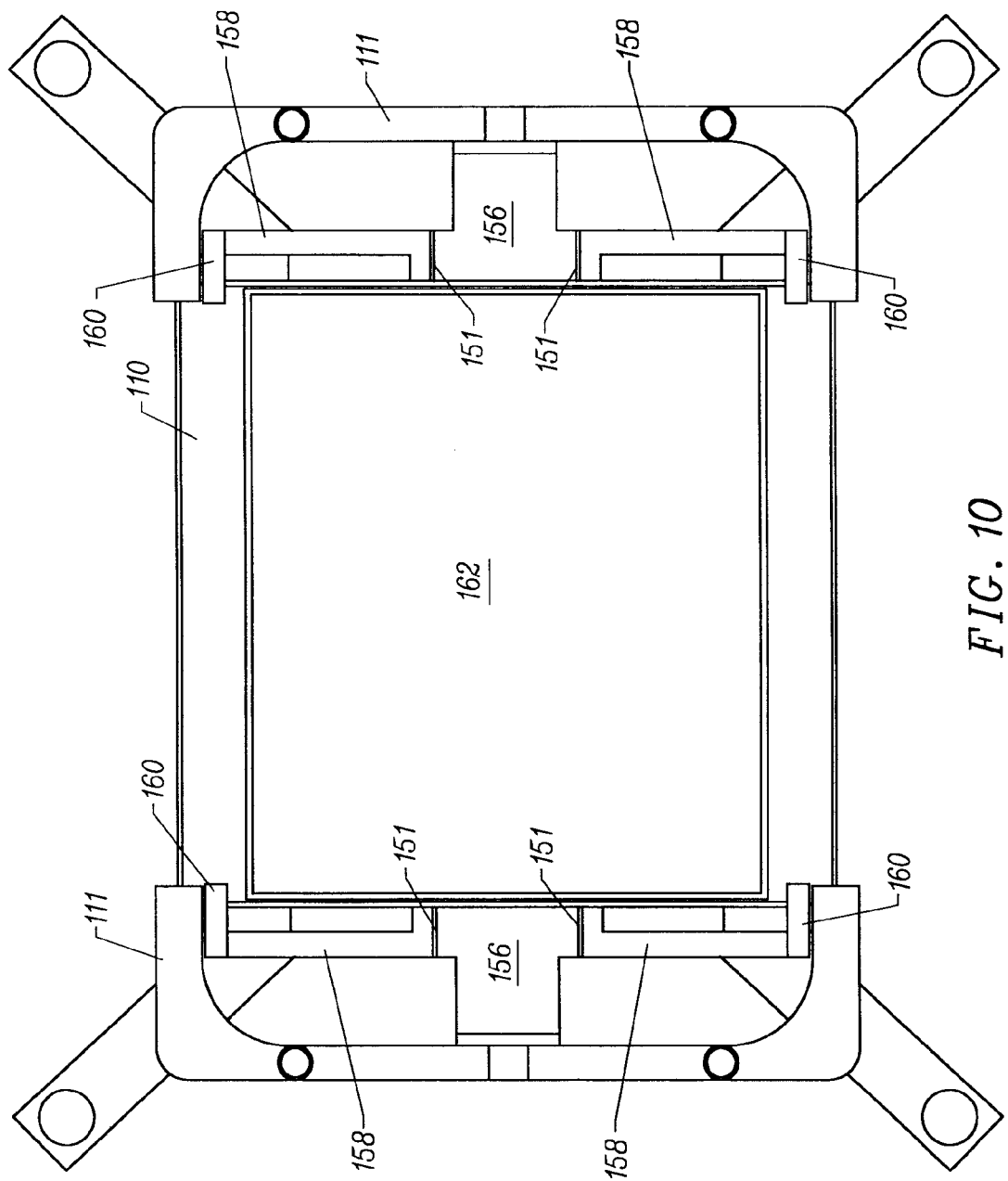
FIG. 10 is a bottom view of the gripper mechanism of the arm assembly where the pelicle on a bottom surface of the reticle is transversely oriented.
Figure 11:
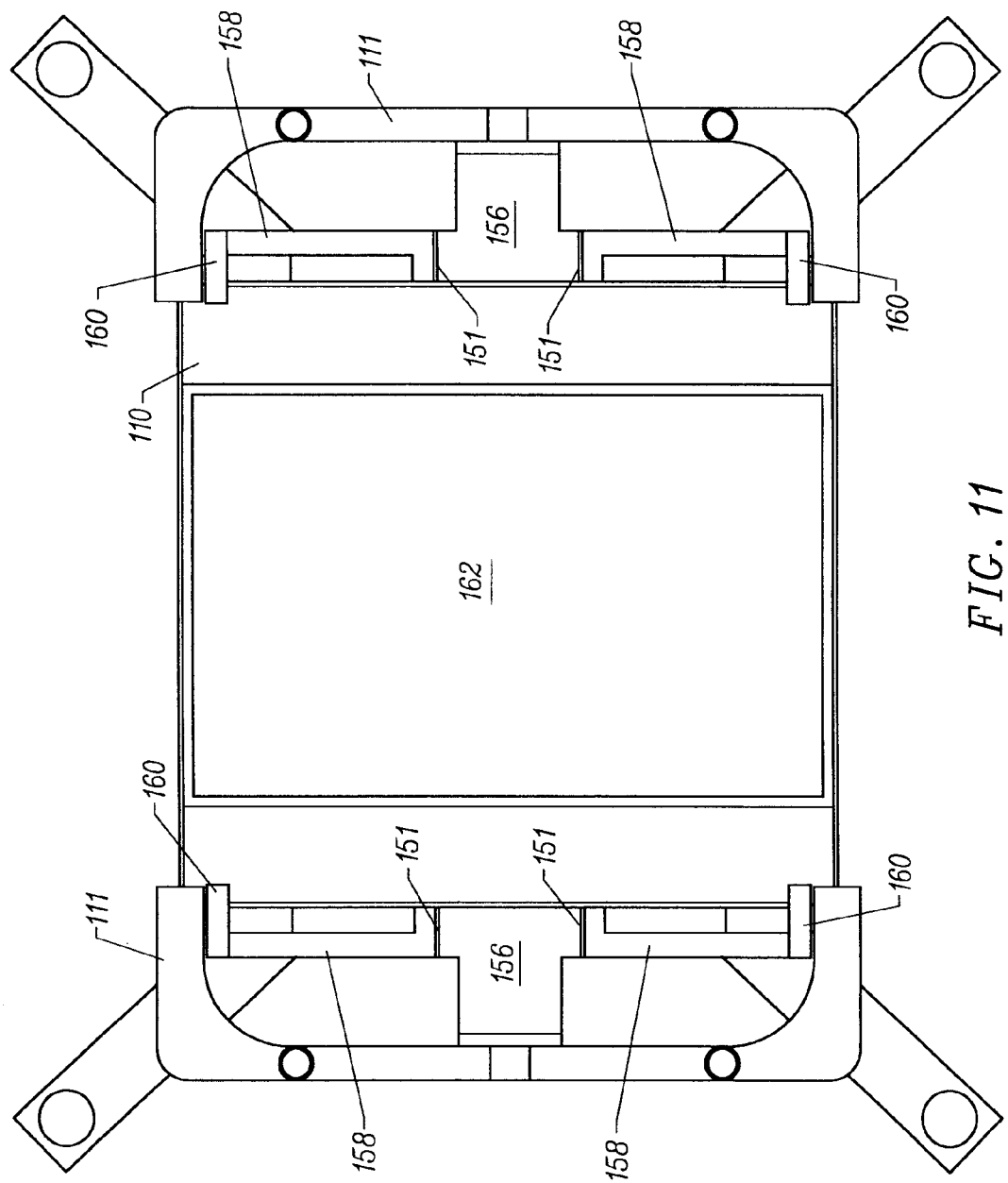
FIG. 11 is a bottom view of the gripper mechanism of the arm assembly with the pelicle on a bottom surface of the reticle being longitudinally oriented.

As shown in FIGS. 5 and 10–11, each gripper 148 preferably includes a central section 156 which is pivotally mounted to the arm mounting block 138 at its first end, and which spreads out into sections 158 at its second end. Sections 158 allow each gripper 148 to engage and grip the reticle 110 across substantially the entire edge of reticle 110, but are sized so as not to contact the standoffs 111. As discussed in the Background of the Invention section, it is important that contact between the grippers 148 and the upper or lower surfaces of reticle 110 be minimized. As such, as best seen in FIG. 9, the distal tip of each gripper 148 includes a vertical section 149 which engages an edge 150 of the reticle. As shown in FIGS. 5 and 9–11, sections 158 of each gripper 148 include a pair of O-rings 151 wrapped thereabout, which O-rings 151 are compressed by the engagement of vertical edge 149 against the reticle edge 150, thereby ensuring a tight and non-slipping engagement between each gripper 148 and reticle 110. The distal tip of each of the grippers 148 further includes an angled chamfer 152 provided to engage a similarly angled section 154 formed in a lower edge of the reticle 110. Thus, contact with a lower edge of the reticle 110 is avoided.

The vertical edge 149, O-ring 151 and chamfer 152 are in general sufficient to securely support the reticle 110 during transport of the reticle 110 as described hereinafter. However, it is conceivable that the reticle transfer mechanism 100 may receive a shock during transport, or that the reticle 110 may otherwise slip below chamfer 152. Therefore, as best shown in FIGS. 6 and 9–13, grippers 148 each include a pair of safety catches 160 at the ends of sections 158, which safety catches extend inward under the reticle 110. As best shown in FIG. 9, there is preferably a slight clearance between reticle 110 and safety catches 160 so that during normal operation of the reticle transport system 100, safety catches 160 do not come into contact with the reticle 110. However, in the event reticle 110 becomes dislodged from chamfer 152, safety catches 160 will prevent the reticle 110 from falling off of the gripping mechanism 128.

Referring now to the side view of FIG. 8 and the bottom views of FIGS. 10 and 11, as is known in the art, a pellicle 162 is preferably mounted to a lower surface of reticle 110. The pellicle 162 may either be transversely oriented as shown in FIG. 10 or longitudinally oriented as shown in FIG. 11. The safety catches 160 are preferably located at the ends of sections 158 of grippers 148 so that the catches 160 will be located away from pellicle 162 regardless of whether the pellicle is transversely or longitudinally oriented.

Figure 12:
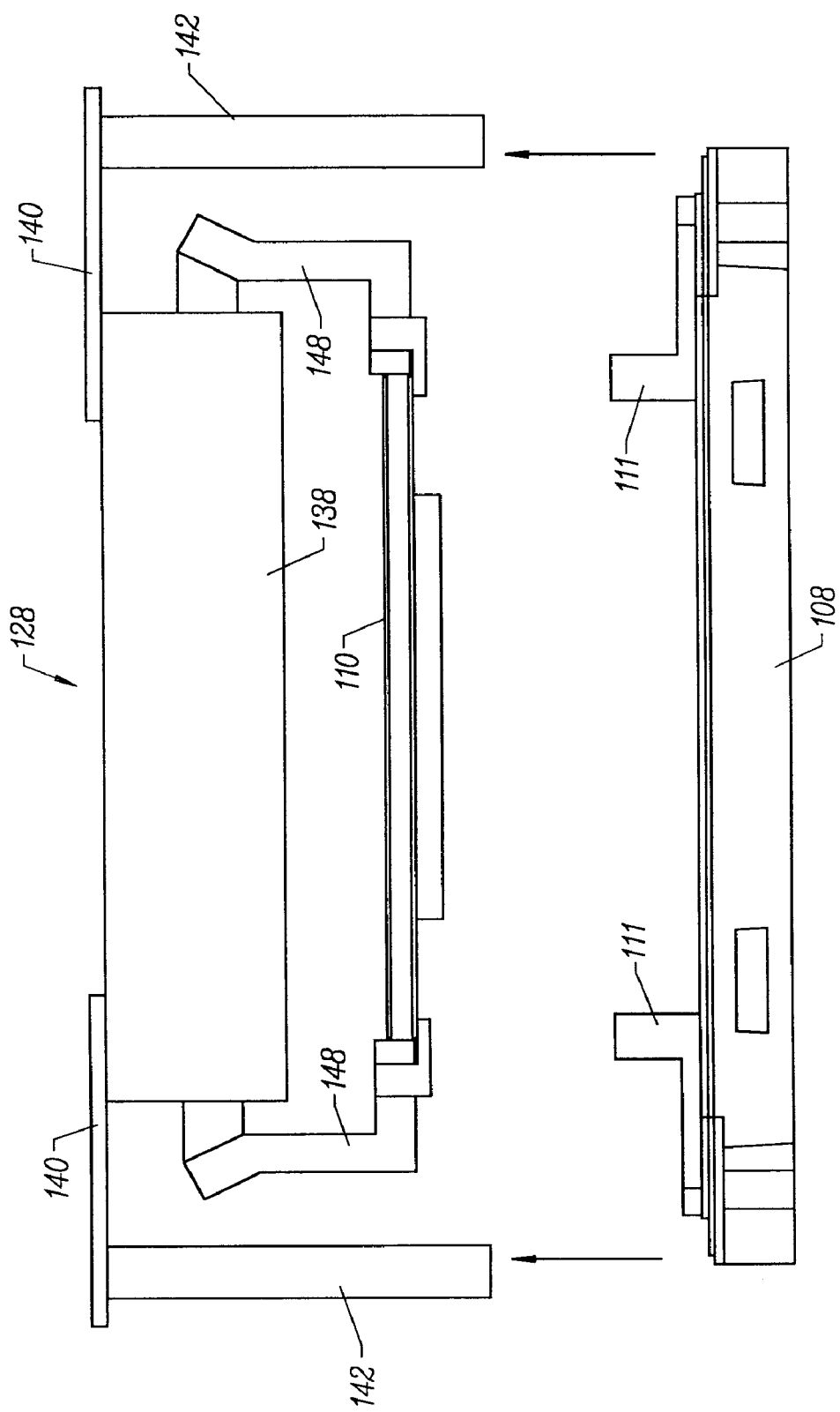
FIG. 12 is a side view showing the gripper mechanism according to the present invention carrying a reticle away from the port door.
Figure 13:
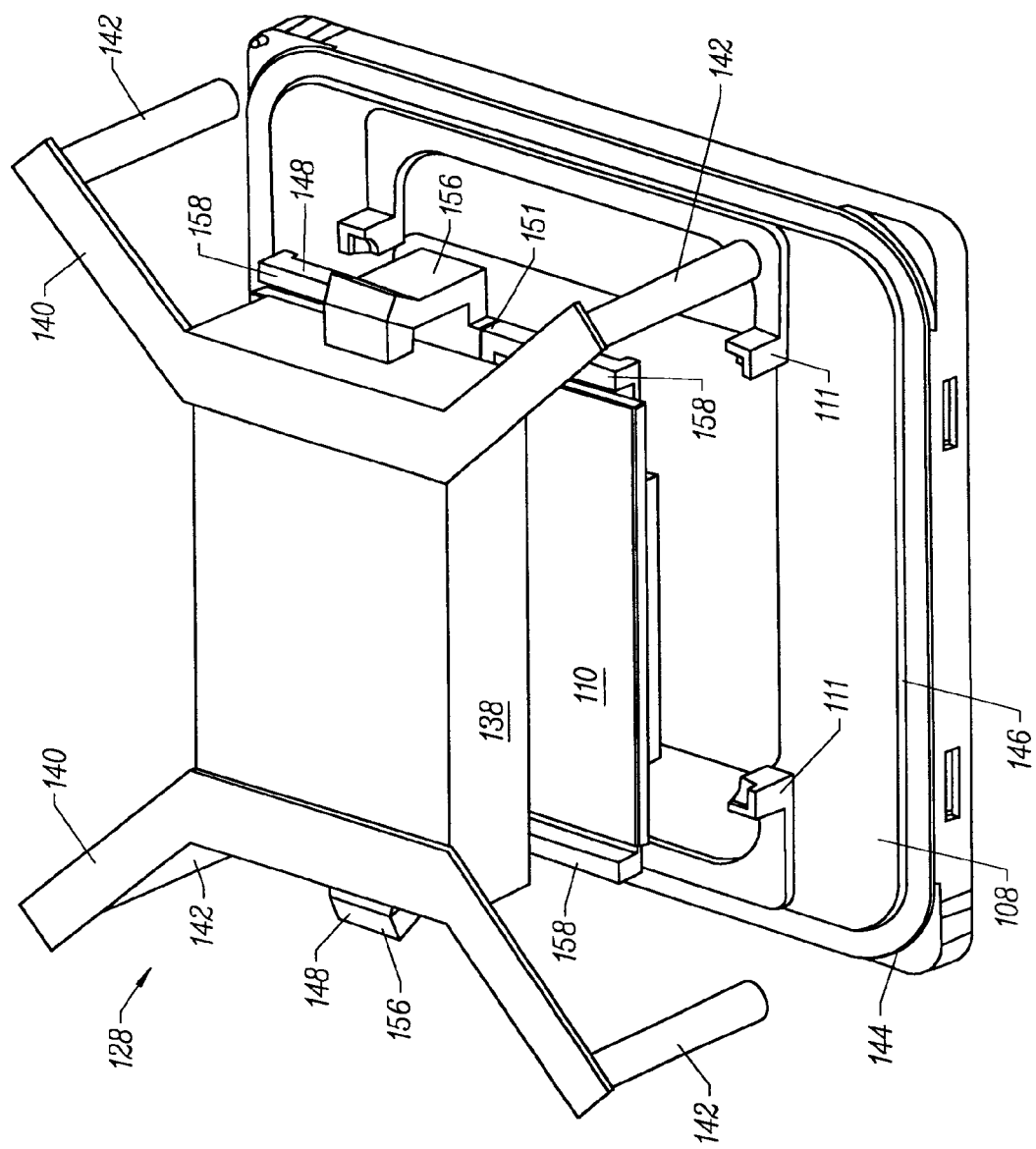
FIG. 13 is a perspective view showing the gripper mechanism of the present invention carrying a reticle away from the port door.

In operation, the arm assembly 124 rotates and translates the gripping mechanism 128 so that posts 142 rest on the outer rim section 144. Once the sensors within the arm mounting block 138 detect this condition, the grippers 148 are rotated inward from their retracted position shown in FIG. 7 to a position where they grip the reticle 110 at its edges as shown in FIG. 8 and as described above. The arm assembly 124 may thereafter lift the reticle 110 away from door 108 as shown in FIGS. 12 and 13.

Figure 14:
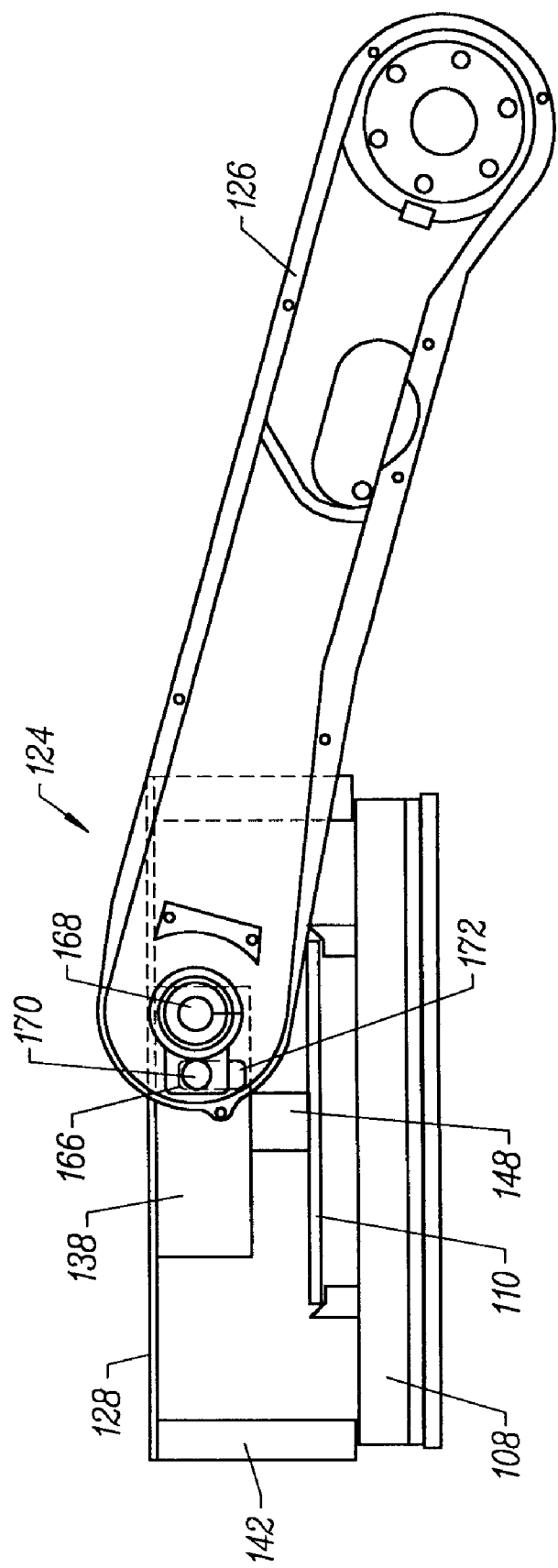
FIG. 14 is a side view of the arm assembly showing the mounting of the gripper mechanism on the transport arm.

FIG. 14 shows the mounting of the gripping mechanism 128 to the arm 126. A plate 166 is rotatably coupled to arm 126 through a shaft 168. A motor (not shown) is provided for rotating plate 166 with respect to arm 126, which rotation is controlled by the CPU. A pin 170 is fixedly mounted to the plate 166, which pin extends into a slot 172 formed in the arm mounting block 138. The engagement of pin 170 within slot 172 is such that rotation of the arm mounting block and gripper mechanism is prevented with respect to the pin 170 and plate 166. However, the arm mounting block and gripper mechanism are capable of free translation with respect to pin 170 and plate 166 to the extent allowed by slot 172. Just prior to engagement of posts 142 with the outer rim 144 of door 108, the weight of gripper mechanism 128 will cause the uppermost portion of slot 172 to lie in engagement with pin 170 as shown in FIG. 14. However, when the arm 126 has rotated and/or translated sufficiently so that posts 142 are positioned on the outer rim 144 of door 108, the position of gripper mechanism 128 and slot 172 are then fixed. Thereafter, the sensors within arm mounting block 138 which indicate the location of posts 142 on door 108, in addition to activating inward rotation of grippers 148, also indicate to the CPU to stop translation and rotation of arm 126. Slot 172 is provided to increase the tolerance of the system so that the movement of arm 126 does not have to be stopped precisely when posts 142 engage the door 108. To the extent that arm 126 continues to rotate and/or translate after posts 142 engage door 108, the slot 172 allows relative movement of the arm 126 and pin 170 with respect to the slot 172 and gripper mechanism 128. In particular, slot 172 allows arm 126, plate 166 and pin 170 to move downward a small distance relative to gripper mechanism 128 after the gripper mechanism is fixed in its position with respect to door 108.

Figure 16:
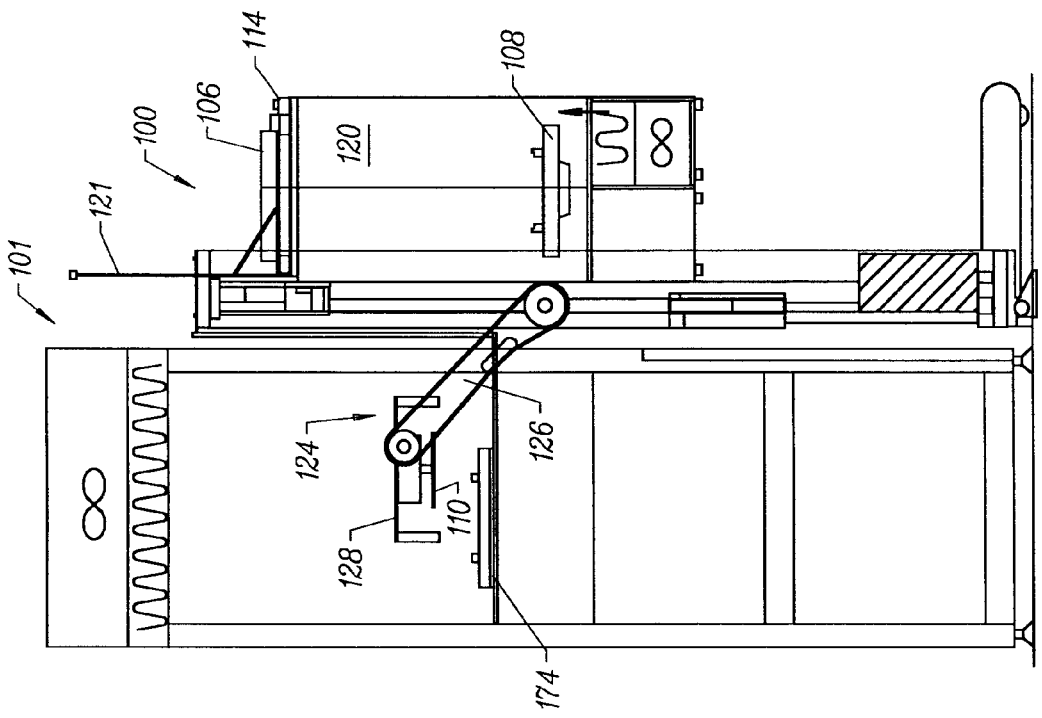
FIG. 16 is a side view of the reticle transfer system according to the present invention affixed to a minienvironment showing the arm assembly bringing the reticle into the minienvironment.
Figure 15:
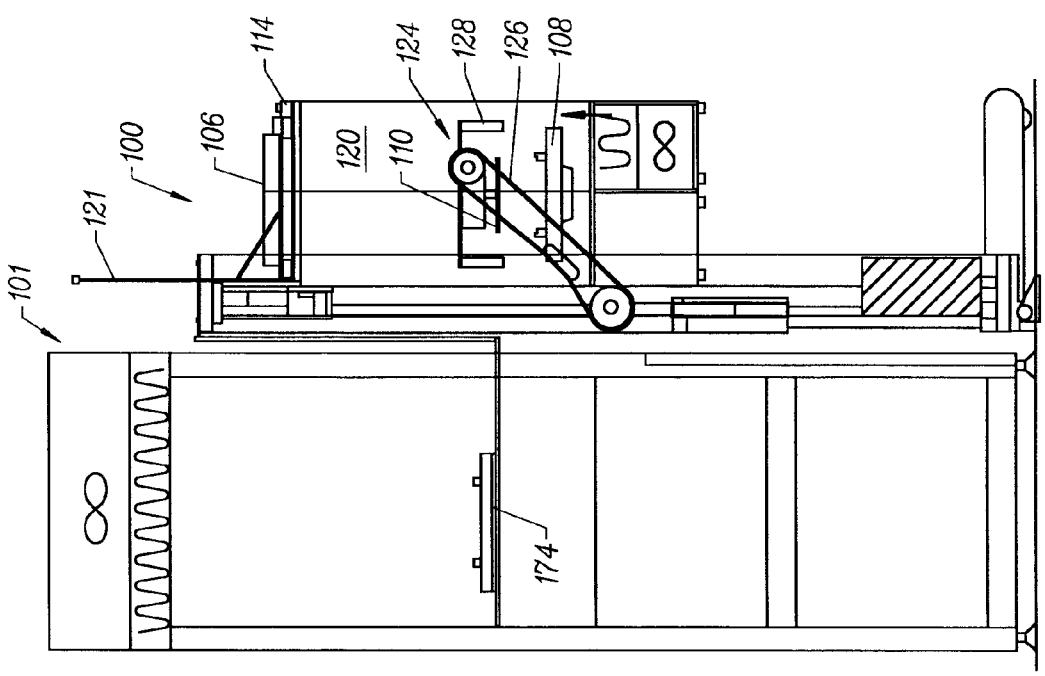
FIG. 15 is a side view of the reticle transfer system affixed to a minienvironment showing the arm assembly carrying a reticle away from the port door.
Figure 17:
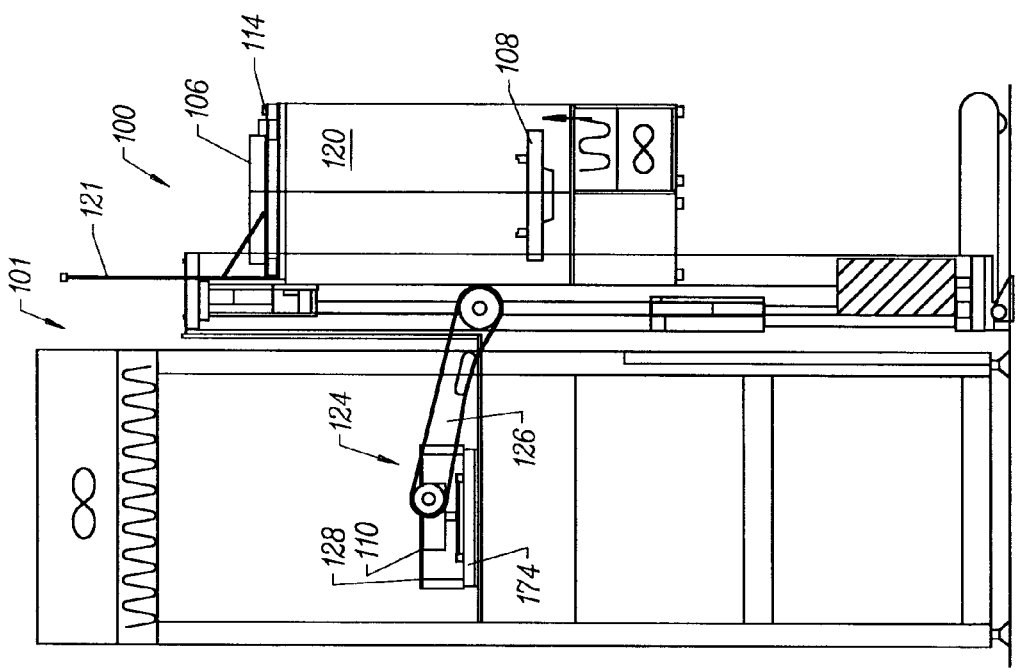
FIG. 17 is a side view of a reticle transfer system according to the present invention affixed to a minienvironment showing the arm assembly locating the reticle on a support platform within the minienvironment.
Figure 18:
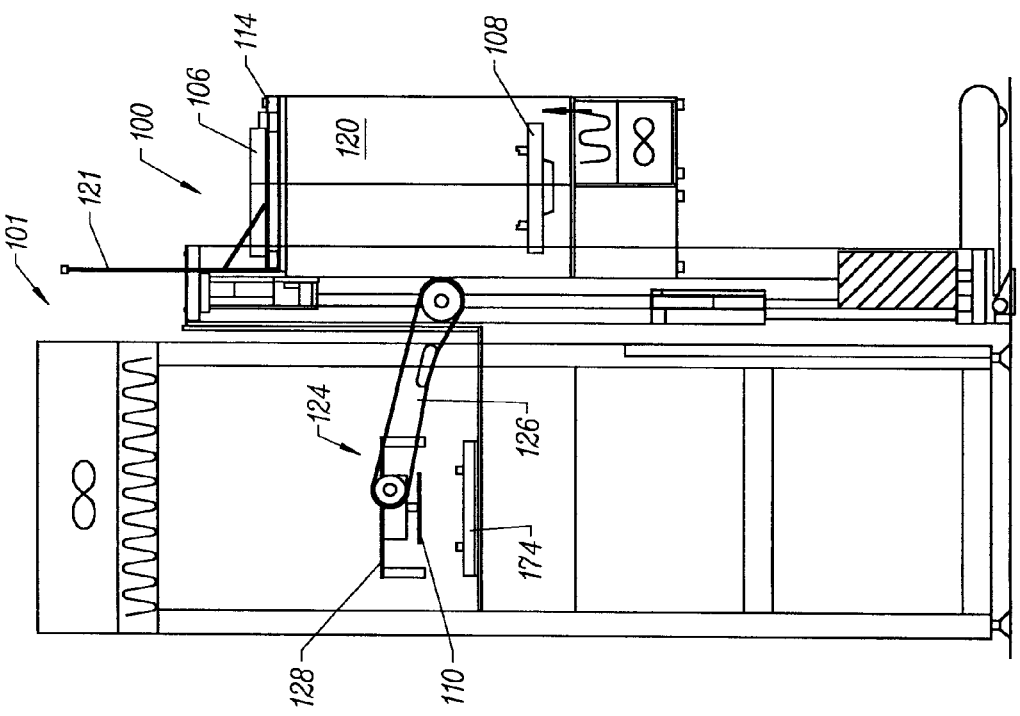
FIG. 18 is a side view of the reticle transfer system according to the present invention affixed to a minienvironment where the arm assembly has located the reticle on the support platform within the minienvironment.

After the gripper mechanism 128 is positioned on the door 108, additional sensors (not shown) indicate when grippers 148 have rotated inward into secure engagement with the reticle 110. As shown in FIGS. 12, 13 and 15, the arm assembly 124 thereafter lifts the reticle 110 off of door 108 and thereafter rotates and/or translates into the minienvironment 101 as shown in FIGS. 16 and 17 to position the reticle on a support plate 174 within the minienvironment 101 as shown in FIG. 18.

Figure 19:
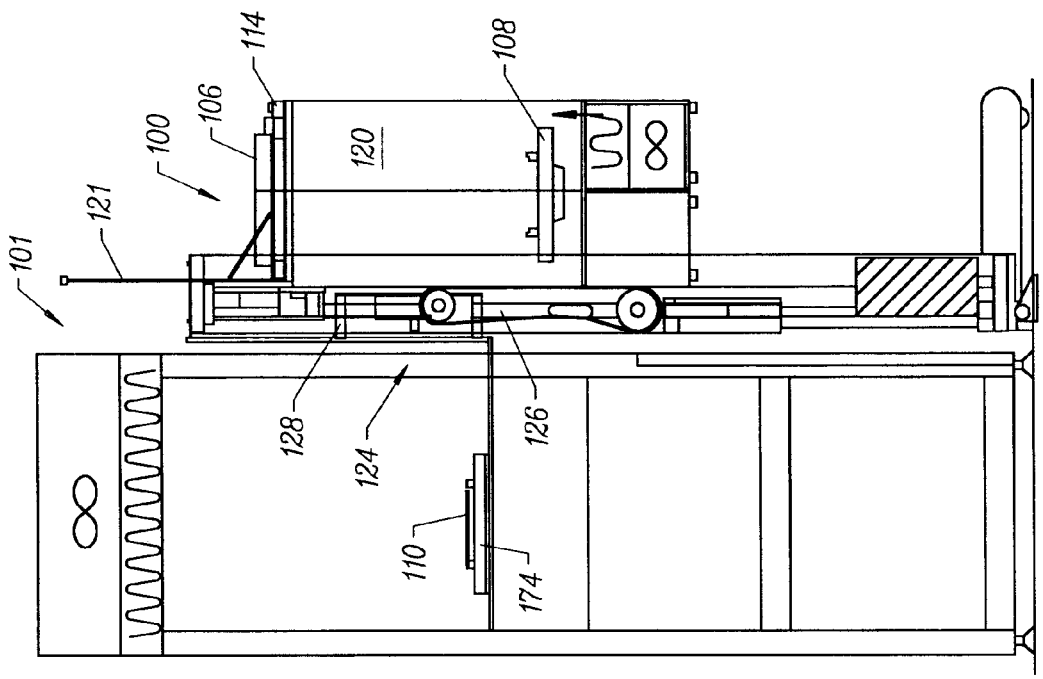
FIG. 19 is a side view of the reticle transfer assembly according to the present invention affixed to a minienvironment after the arm assembly has deposited the reticle on the support platform within the minienvironment.
Figure 20:
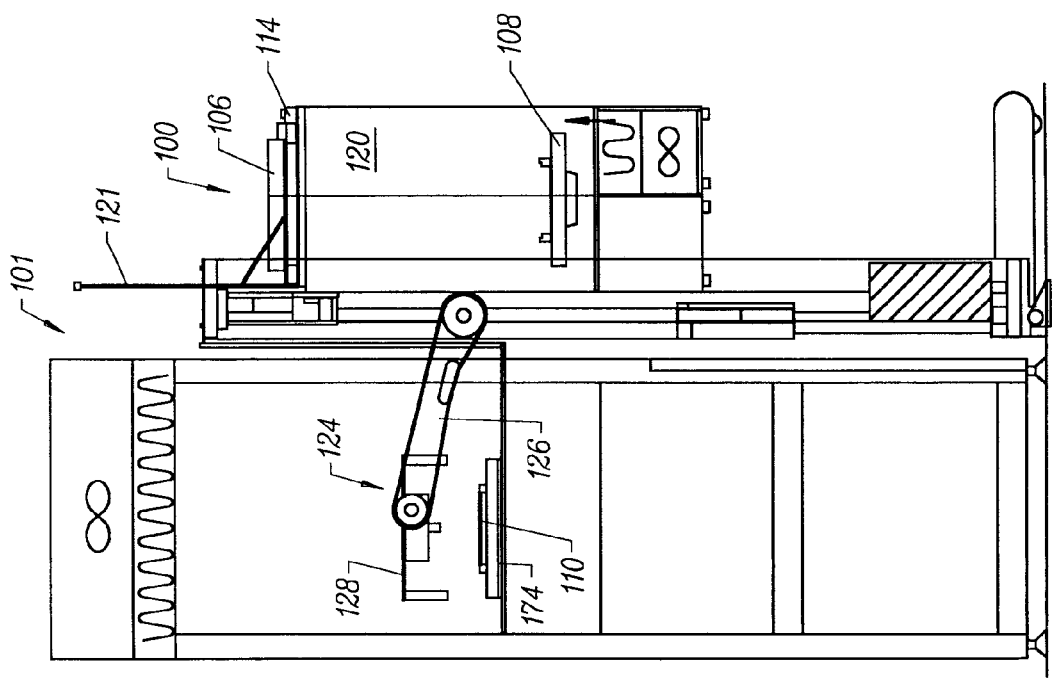
FIG. 20 is a side view of a reticle transfer system according to the present invention affixed to a minienvironment showing the arm assembly retracted to its home position after depositing a reticle within the minienvironment.

The upper surface of support plate 174 is identical to door 108 and includes standoffs. As such, when posts 142 engage support plate 174, the reticle 110 is properly positioned within the standoffs in support plate 174. Upon detection of engagement of the post 142 with the support plate 174 by the sensors within the arm mounting block 138, the CPU retracts the grippers 148 from their engagement with the reticle 110, and the gripper mechanism 128 is translated and/or rotated away from the reticle 110 as shown in FIG. 19. The arm assembly 124 then moves to its home position as shown in FIG. 20 while the reticle 110 is transported and/or processed within the processing tool (not shown).

After processing of reticle 110 is complete and the reticle is in the support plate 174, the above-described steps are reversed so that the reticle is gripped and removed from support plate 174 by arm assembly 124 and returned to its position seated within standoffs 111 on the door 108. Thereafter, the arm assembly 124 again retracts to its home position, and the port plate 114 and minienvironment 120 are lowered to again couple the shell 106 with the door 108 as shown in FIG. 1. Thereafter, the reticle container 104 may be automatedly or manually transferred away from the reticle transfer system 100 and a new container 104 and reticle 110 loaded onto load port 102 of the system 100 for processing.

As described in the background of the invention section, conventional systems used an input/output device for receiving and separating the reticle pod, and then a three degrees of freedom robot transferred the reticle from the interface to the support plate in the minienvironment. Thereafter, as in the present invention, a reticle handling robot within the process tool transferred the reticle between the process tool and the support platform in the minienvironment. Owing to the separate input/output device and transfer robot in the minienvironment, conventional reticle transfer systems required a relatively large amount of space in front of the process tool. The reticle transfer system according to the present invention allows reticle transfer between a container and the support platform within the minienvironment without having a separate input/output device and reticle handling robot such as found in conventional systems. This allows a space reduction in the present invention of approximately 50% over conventional systems.

The invention has been described thus far as operating with a SMIF system. However, it is contemplated that the present invention operate with other systems. For example, a reticle mounted on a support plate, but without a covering shell may be loaded onto the port door 112 of the load port 102. In this embodiment, the port plate may raise upward without the shell seated thereon, and the reticle transferred as described above. The lengths of each of the posts must be provided so that, when the posts are seated on the outer rim of the support platform, the grippers 148 are properly positioned with respect to the reticle.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A reticle transfer device affixed to a minienvironment, the minienvironment being part of or adjacent to a process tool, the reticle transfer device comprising:
    a plate for receiving the reticle and presenting the reticle for transfer; and
    a transfer assembly, including:
        an arm capable of rotation and translation, and
        a gripping mechanism rotationally mounted to said arm for gripping the reticle, said gripping mechanism including an active gripper capable of being driven between a first retracted position where said gripping mechanism does not engage the reticle, and a second extended position where said gripping mechanism engages the reticle, said active gripper including a vertical surface for engaging a vertical edge of the reticle, said active gripper further including an angled surface mounted at a bottom of said vertical surface, said angled surface capable of engaging an angled chamfer formed on a bottom of the reticle.

2. A reticle transfer device as recited in claim 1, wherein said transfer device transfers the reticle between said plate and the minienvironment by verticle translation and rotation about a single horizontal axis.

3. A reticle transfer device affixed to a minienvironment, the minienvironment being part of or adjacent to a process tool, the reticle transfer device comprising:
    a support platform;
    a reticle on the support platform, said reticle having an edge;
    a first plate for receiving the support platform and presenting the reticle for transfer; and
    a transfer assembly, including:
        an arm capable of rotation and translation, and
        a gripping mechanism mounted to said arm for gripping the edge of said reticle, said gripping mechanism including downwardly extending posts for engaging the support platform and defining a fixed, repeatable position of said gripping mechanism with respect to said first plate when said gripping mechanism grips the reticle, the posts being separated from the reticle when engaging the support platform.

4. A reticle transfer device as recited in claim 3, wherein said gripping mechanism is capable of gripping the reticle without contacting an upper or lower surface of the reticle.

5. A reticle transfer device as recited in claim 3, wherein a tolerance is provided in said mounting of said gripping mechanism to said arm, said tolerance allowing said arm to move while said posts fix a position of said gripping mechanism with respect to said support platform.

6. A reticle transfer device as recited in claim 3, wherein said support platform comprises a door to a container in which the reticle is located when the reticle is received on said first plate.

7. A reticle transfer device as recited in claim 5, wherein the reticle transfer device further comprises a second plate surrounding said first plate, said second plate provided for supporting a top to said container, and said second plate capable of moving away from said first plate to separate said container door from said container top.

8. A reticle transfer device as recited in claim 6, wherein the reticle transfer device further comprises a second minienvironment for surrounding the reticle with clean air after the container top is separated from the container door.

9. A reticle transfer device as recited in claim 1, wherein said vertical surface is formed of an elastomeric material.

10. A reticle transfer device as recited in claim 1, wherein said gripping assembly further includes downwardly extending ports for engaging said plate and defining a fixed, repeatable position of said gripping mechanism with respect to said plate when said gripping mechanism grips the reticle, the posts adapted to not contact the reticle.

11. A reticle transfer device affixed to a minienvironment, the minienvironment being part of or adjacent to a process tool, the reticle transfer device comprising:
    a plate for receiving the reticle and presenting the reticle for transfer; and
    a transfer assembly, including:
        an arm capable of rotation and translation, and
        a gripping mechanism rotationally mounted to said arm for gripping the reticle, said gripping mechanism including:
            an elastomeric verticle surface capable of being driven into engagement with a vertical edge of the reticle to support the reticle, and
            an angled surface mounted at a bottom of said verticle surface, said angled surface capable of engaging an angled chamfer formed on a bottom of the reticle.

12. A reticle transfer device as recited in claim 11, further comprising safety catches capable of extending beneath and being spaced from the reticle when the active gripper is in said position, said safety catches being capable of catching the reticle in the event said engagement between said vertical surface and the verticle edge of the reticle is unintentionally lost.

13. A transfer device for a reticle having vertical edges, the transfer device comprising:
    a plate for supporting the reticle;
    a transfer arm capable of horizontal and vertical translation; and
    a gripper mounted to the transfer arm having at least two vertical surfaces for engaging at least two vertical edges of the reticle, the vertical surfaces adapted to move between a first position and a second position where the vertical surfaces of the gripper engage the vertical edges of the reticle, each vertical surface of the gripper having an angled portion mounted at a bottom of the vertical surface adapted to engage an angled chamfer formed on a bottom of the reticle.

14. A transfer device according to claim 13, further comprising safety catches adapted to extend beneath the reticle when the gripper is in the second position, the safety catches separated from the reticle and adapted to catch the reticle in the event that engagement between at least one of the vertical surfaces of the gripper and a respective vertical edge of the reticle is lost.

15. A transfer device according to claim 13, wherein the gripper further includes downwardly extending posts for engaging the plate and defining a fixed, repeatable position of the gripper with respect to the plate when the gripper engages the reticle, the posts adapted to not contact the reticle.

16. A transfer device according to claim 13, further comprising a minienvironment, wherein the transfer arm transfers the reticle between the plate and the minienvironment by vertical translation and rotation about a single horizontal axis.

17. A reticle transfer device as recited in claim 13, wherein the vertical surfaces are formed of an elastomeric material.

* * * * *

UNITED STATES PATENT AND TRADEMARK OFFICE
CERTIFICATE OF CORRECTION

PATENT NO.    : 6,364,595 B1
DATED         : April 2, 2002
INVENTOR(S)   : Anthony C. Bonora, William J. Fosnight and Joshua W. Shenk It is certified that error appears in the above-identified patent and that said Letters Patent is hereby corrected as shown below:

Column 9,
Line 33, delete "verticle" and insert -- vertical --

Column 10,
Line 13, delete "ports" and insert -- posts --
Lines 27, 30 and 38, delete "verticle" and insert -- vertical --
Line 36, immediately following the phrase "when the active gripper is in said," insert -- second --
Line 45, immediately following the phrase "a gripper mounted to the transfer arm," insert -- and --

Signed and Sealed this

Twenty-fourth Day of September, 2002

Attest:

JAMES E. ROGAN
Attesting Officer        Director of the United States Patent and Trademark Office